United States Patent [19]

Sarinopoulos et al.

[11] 4,013,928
[45] Mar. 22, 1977

[54] CARD CAGE ASSEMBLY

[75] Inventors: George A. Sarinopoulos; Robert E. McCarthy, both of Oklahoma City; Joseph R. Waldrop, Bethany, all of Okla.

[73] Assignee: Honeywell Information Systems, Inc., Waltham, Mass.

[22] Filed: Apr. 24, 1974

[21] Appl. No.: 463,694

[52] U.S. Cl. .............................. 361/380; 211/41; 361/429

[51] Int. Cl.² .................................... H02B 1/02

[58] Field of Search ............... 317/101 DH; 211/41

[56] References Cited
UNITED STATES PATENTS 3,458,767  7/1969  Hedger et al. ............. 317/101 DH
3,511,385  5/1970  Ayling ....................... 317/101 DH
3,699,396  10/1972  Colaud et al. ............ 317/101 DH Primary Examiner—David Smith, Jr.
Attorney, Agent, or Firm—William F. White; Ronald T. Reiling

[57] ABSTRACT

An improved card cage assembly used in data processing equipment to hold printed wire boards containing electrical circuitry. The improved assembly has a rear bar and a front bar with extruded channels formed therein. The channels receive thread-forming screws and a nut strip for ease in construction and for the elimination of back panel stresses.

6 Claims, 2 Drawing Figures

CARD CAGE ASSEMBLY

BACKGROUND OF THE INVENTION

1. Field of the Invention

This invention relates to an improvement in a card cage assembly, also commonly called a printed wire board module. Such assemblies include electrical connectors rigidly secured to a panel. Printed wiring boards mounted in card guides may be pushed into contact with the electrical connectors. This assembly may be used singularly or in a series of assemblies with common back panels and side plates. Through the use of connecting bars, (i.e., a front bar, a clamping bar, and a rear bar) the electrical connectors, back panels, side plates, and card guides are secured together to make up the assembly.

2. Brief Description of the Prior Art

It is common in the data processing industry to use card cage assemblies to hold printed wire boards having electrical circuitry. The assemblies normally have connecting bars for holding the electrical connectors in place so that the printed wire boards held by card guides can be secured to the electrical connectors. These assemblies have been made without regard to the design and construction of the connecting bars and how the card cage is assembled. Little consideration was given to the cost and labor required in securing the back panel and the side plates to the connecting bars or to the need for rigidly securing the ends of the electrical connectors to the connecting bars without developing stresses in the back panel which could cause malfunctions.

SUMMARY OF THE INVENTION

The subject invention eliminates the aforesaid problems, thereby improving the overall durability and quality of the assembly and reducing the cost and labor in the construction of the assembly.

The improved card cage assembly includes a back panel, side plates, card guides, an elongated rear bar, an elongated clamping bar, electrical connectors having end portions secured to the rear bar and the clamping bar, and an elongated front bar; the front bar and the clamping bar supporting the card guides. Broadly described, the improved card cage assembly includes extruded channels formed along the longitudinal axis of the front bar and the rear bar for receiving thread-forming screws which secure the back panel and the side plates to the connecting bars.

BRIEF DESCRIPTION OF THE DRAWINGS

While the specification concludes with claims particularly pointing out and distinctly claiming that which is regarded as the present invention, details of a preferred embodiment of the invention along with its further objects and advantages may be more readily ascertained from the following detailed description when read in conjunction with the accompanying drawings wherein:

DETAILED DESCRIPTION OF THE PREFERRED EMBODIMENTS

Figure 1:
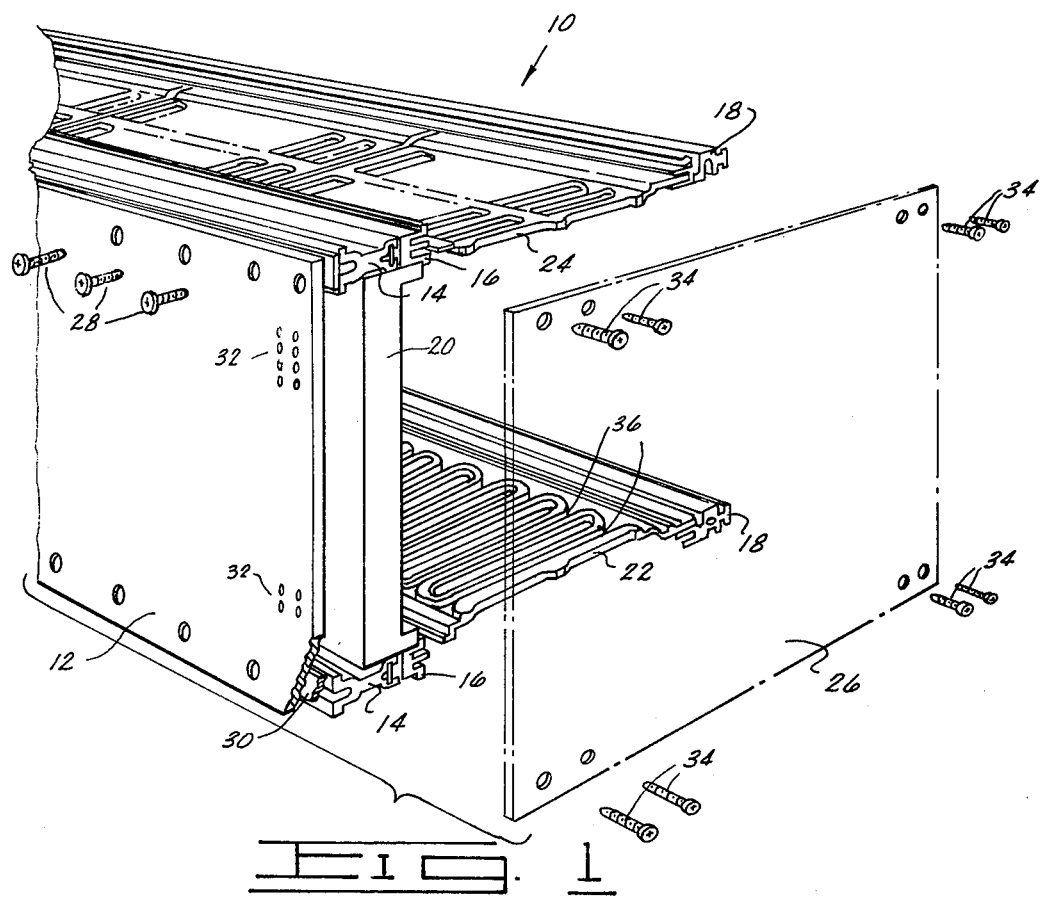
FIG. 1 is a perspective view of the improved card cage assembly.

In FIG. 1, the improved card cage assembly is designated by general reference character number 10. Assembly 10 includes a back panel 12, a rear bar 14, a clamping bar 16, a front bar 18, an electrical connector 20, a lower card guide 22, an upper card guide 24, and a side plate 26. The back panel 12 is secured to the rear bar 14 by thread-forming screws 28. Also shown is an insulating strip 30 disposed between the back panel 12 and the rear bar 14. Contacts 32 attached to back panel 12 provide an electrical contact with the connector 20. While only a set of contacts 32 are shown, it is to be understood that the back panel 12 may contain a large number of contacts 32. The side plate 26 is secured to the rear bar 14 and the front bar 18 by thread-forming screws 34. Printed wire boards which are not shown in this figure are slid into the card guide slots 36 until they are electrically connected to the connector 20.

Figure 2:
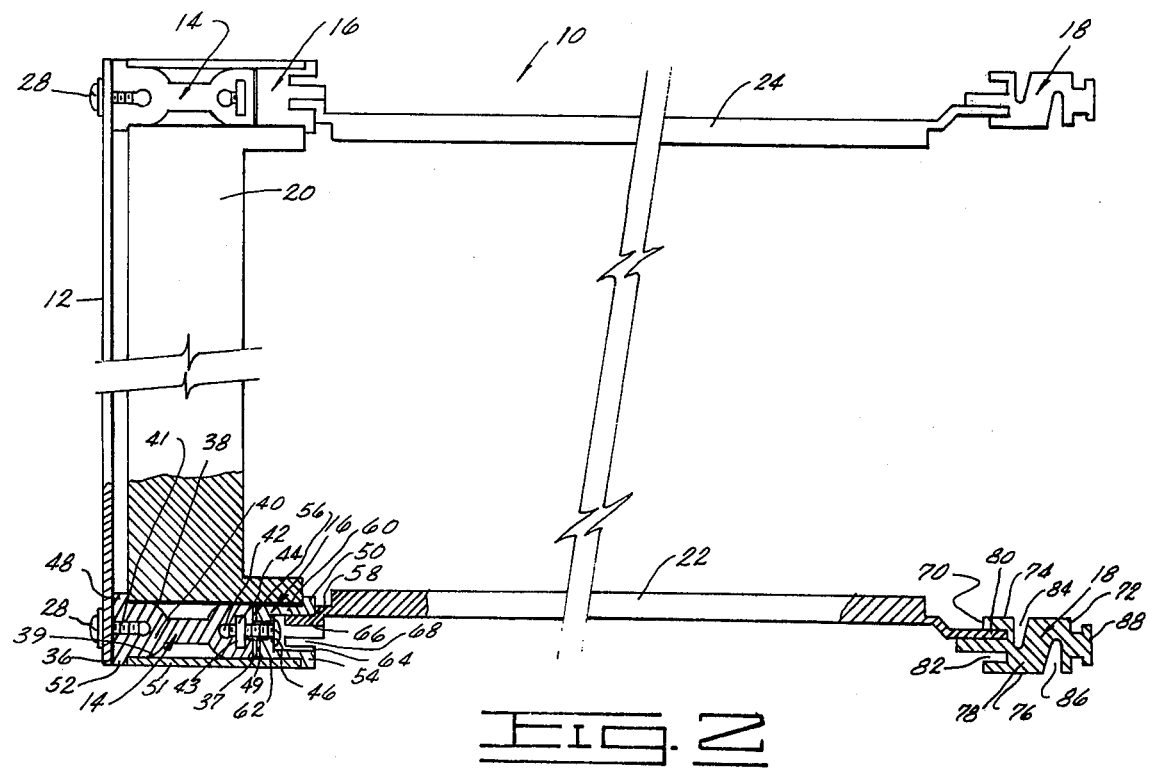
FIG. 2 is a side view of the improved card cage assembly.

Referring now to FIG. 2, this figure more clearly shows a cross-sectional view of the rear bar 14, the connecting bar 16, and the front bar 18. The rear bar 14 is illustrated by having a first side portion 36, a second side portion 37, a top portion 38, a bottom portion 39, and an end portion 40. Formed in the first side portion 36 along the longitudinal axis of the bar 14, is an extruded U-shaped channel 41 for receiving the thread-forming screws 28 for securing the back panel 12 to the first side portion 36 of the rear bar 14. The second side portion 37 of the rear bar 14 also has an extruded U-shaped channel 42 with a nut strip retaining channel 43 formed therein. The retaining channel 43 holds a nut strip 44 for receiving a threaded screw 46 for securing the clamping bar 16 to the rear bar 14. While a threaded screw 46 is used, it should be mentioned that a thread-forming screw may also be used for engaging nut strip 44. The extruded U-shaped channels 41 and 42 at end portion 40 also receive thread-forming screws 34, shown in FIG. 1, for securing the side plate 26 to the rear bar 14. The rear bar 14 and the clamping bar 16 are illustrated having flanged portions 48 and 50 disposed adjacent to one end of the electrical connector 20. When threaded screw 46 is inserted into an aperture 49 in the bar 16 and threaded into the nut strip 44 thereby connecting the clamping bar 16 to the rear bar 14, the flanged portions 48 and 50 are drawn one toward the other rigidly clamping one end of the electrical connector 20. This same operation also occurs at the opposite end of connector 20. To eliminate back panel stress, which was caused when the back panel 12, the rear bar 14, and the clamping bar 16 were secured together with a single securing means, the back panel 12 and the clamping bar 16 are each separately secured to the rear bar 14.

A spacer plate 51 is shown secured between flanged portions 52 and 54 of the rear bar 14 and the clamping bar 16. This spacer plate 51 is used to prevent any twisting along the longitudinal axis of the rear bar 14 and clampng bar 16 when they are secured together in the assembly 10. When the card cage assembly 10 is stacked together in a series of assemblies, the one end of an adjacent connector 20 is used in place of the spacer plate 51.

The clamping bar 16 is illustrated having a first side portion 56, a second side portion 58, a top portion 60, a bottom portion 62, and end portion 64. The second side portion 58 is shown having an upper U-shaped slot 66 and a lower U-shaped slot 68 for receiving one end of either the upper card guide 24 or the lower card guide 22, whichever the case may be, or both guides should it be necessary to stack the assemblies one upon the other.

Referring now to the front bar 18 which includes a first side portion 70, a second side portion 72, a top portion 74, a bottom portion 76, and an end portion 78. The first side portion 70 has U-shaped slots 80 and 82 for receiving one end of either the upper card guide 24 or the lower card guide 22, whichever the case may be. The top portion 74 and bottom portion 76 include extruded channels 84 and 86 along the longitudinal axis of the bar 18. The channels 84 and 86 receive the thread-forming screws 34, shown in FIG. 1, at the end portion 78 of the front bar 18 for securing the side plate 26 thereto. The second side portion 72 of the front bar 18 has an extruded elongated T-shaped member 88 for attaching a retaining clip should it be required to hold the printed wire boards more firmly in place.

Changes may be made in combination and arrangement of the elements as heretofore set forth in the specifications and shown in the drawings. It being understood that the changes may be made in the embodiments disclosed without departing from the spirit or scope of the invention as defined in the following claims.

What is claimed is:

1. In a card cage assembly having a back panel, side plates, card guides, an elongated rear bar, an elongated clamping bar, electrical connectors having end portions secured to the rear bar and the clamping bar, and an elongated front bar, the front bar and the clamping bar supporting the card guides, the improvement comprising:
   a. the rear bar further including a first side portion, a second side portion, a top and bottom portion, and end portions, said first side portion having an extruded channel formed therein and said second side portion having an extruded channel formed therein; and
   b. the front bar further including a first side portion, a second side portion, a top and bottom portion, and end portions, said top and bottom portion having extruded channels formed therein; and
   c. thread-forming screw securing means engageable in said channels for constructing the assembly.

2. The assembly as defined in claim 1 wherein said channel formed in said first side portion receives said thread-forming screws for securing the back panel to the rear bar.

3. The assembly as defined in claim 1 wherein said channels formed in said first and second side portions receive said thread-forming screws at said end portions of the rear bar for securing the side plates thereto.

4. The assembly as defined in claim 2 wherein said channels in said top and bottom portions of the front bar receive thread-forming screws at said end portions of the front bar for securing the side plates thereto.

5. In a card cage assembly having a back panel, said plates, card guides, an elongated rear bar having a first side portion, a second side portion, a top and bottom portion, and end portions, an elongated clamping bar having a first side portion, a second side portion, a top and bottom portion, and end portions, electrical connectors having end portions secured to the rear bar and the clamping bar and an elongated front bar having a first side portion, a second side portion, a top and bottom portion, and end portions, the front bar and the clamping bar supporting the card guides, the improvement comprising:
   extruded channels formed in the first and second side portions of the rear bar;
   securing means engagable in said channel in the first side portion of the rear bar for securing the back panel to the rear bar;
   securing means engagable in said channel formed in the second side portion of the rear bar for securing the clamping bar to the rear bar;
   extruded channels formed in the top and bottom portion of the front bar; and
   securing means engagable in said channels formed in the top and bottom portions of the front bar at the end portion thereof and in said channels formed in the first and second side portions of the read bar at the end portion thereof for securing the side plates to the front and rear bars.

6. The assembly as defined in claim 5 wherein said securing means are thread-forming screws.

* * * * *

UNITED STATES PATENT OFFICE
CERTIFICATE OF CORRECTION

PATENT NO. : 4,013,928

DATED : March 22, 1977

INVENTOR(S) : George A. Sarinopoulos, Robert E. McCarthy, Joseph R. Waldrop

It is certified that error appears in the above-identified patent and that said Letters Patent are hereby corrected as shown below:

IN THE CLAIMS

Claim 5, line 40, change "read" to --rear--.

Signed and Sealed this

Twenty-eighth Day of June 1977

[SEAL]

Attest:

RUTH C. MASON
*Attesting Officer*

C. MARSHALL DANN
*Commissioner of Patents and Trademarks*